United States Patent [19]

Bruce et al.

[11] 4,390,836
[45] Jun. 28, 1983

[54] METHOD AND APPARATUS FOR THE DETECTION OF PIPELINE HOLIDAYS

[75] Inventors: Charles R. Bruce, Littleton; Irvin D. Johnson, Englewood, both of Colo.

[73] Assignee: Marathon Oil Company, Findlay, Ohio

[21] Appl. No.: 177,156

[22] Filed: Aug. 11, 1980

[51] Int. Cl.³ .................. G01R 31/00; G01R 31/12; G01V 3/165
[52] U.S. Cl. .................................. 324/54; 324/52; 324/326
[58] Field of Search .................. 324/52, 54, 67, 72, 324/326, 71 R

[56] References Cited

U.S. PATENT DOCUMENTS

| | | | |
|---|---|---|---|
| 2,382,743 | 8/1945 | Penther et al. | 324/67 |
| 2,501,598 | 3/1950 | Eltenton et al. | 324/67 |
| 3,526,831 | 9/1970 | Smith | 324/54 |
| 3,745,452 | 7/1973 | Osburn et al. | 324/54 |
| 3,753,091 | 8/1973 | Daspit | 324/54 |
| 4,061,965 | 12/1977 | Nelson | 324/54 X |
| 4,091,322 | 5/1978 | Stankoff | 324/67 X |
| 4,099,117 | 7/1978 | Erath | 324/54 |
| 4,134,061 | 1/1979 | Gudgel | 324/326 X |
| 4,220,913 | 9/1980 | Howell et al. | 324/326 X |
| 4,295,095 | 10/1981 | Thomas et al. | 324/326 |

Primary Examiner—Gerard R. Strecker
Attorney, Agent, or Firm—Jack L. Hummel

[57] ABSTRACT

A method and apparatus are provided for detecting and locating holidays in an insulating coating of a subterranean pipeline. An alternating current is induced in the portion of the pipeline being surveyed. The pipeline is tracked by sensing the normal electromagnetic field generated by the current flowing in the pipeline. Leakage current indicative of the location and magnitude of a holiday in the pipeline coating is sensed by a pair of coil members adapted to be located above the ground on opposite sides of a vertical plane including the longitudinal axis of the pipeline with the central axes of the coil members being oriented generally parallel to the central axis of the pipeline, whereby an electrical current signal is induced in the pair of coil members by an electromagnetic field generated by the leakage current. The electrical current signal is displayed to provide an indication of the location and magnitude of the holiday.

10 Claims, 5 Drawing Figures

METHOD AND APPARATUS FOR THE DETECTION OF PIPELINE HOLIDAYS

BACKGROUND OF THE INVENTION

1. Field of the Invention:

This invention relates to methods and apparatus for the inspection of pipelines. More particularly, this invention relates to methods and apparatus for detecting and locating breaks in a non-conductive, protective coating of a subterranean pipeline by detecting electromagnetic fields generated by leakage current flowing through breaks in the protective coating.

2. Description of the Prior Art:

Electrically conductive metallic pipelines, particularly subterranean pipelines employed to convey crude oils, liquid petroleum products, slurried waxy hydrocarbons, natural gas, slurried coal particles, water and like materials are commonly wrapped and/or coated with a protective insulating material. The protective coating reduces or prevents exposure of the pipeline to the subterranean electrolytic environment and thereby reduces cathodic corrosion of the pipeline material. When a break in the protective coating (or a "holiday") occurs, the pipeline is subjected to electrolytic corrosion in the vicinity of the holiday, which if allowed to continue may result in product leakage and contamination of the surrounding environment and the product.

In order to avoid corrosive pipeline damage, various apparatus have been suggested for locating holidays in the protective coatings of pipelines. For example, U.S. Pat. No. 2,650,346 of Rasor discloses a device for applying a high test voltage across a protective coating between the pipeline and an electrical probe adapted to conform to and contact a portion of the outside of the coating to cause a spark to jump through holidays in the coating between the pipeline and the probe. U.S. Pat. No. 3,753,091 of Daspit discloses a device for detecting faults in non-conductive coatings of underwater pipelines as the pipelines are being laid by injecting an alternating current into the pipeline and sensing a magnetic field caused by leakage current with a sensing coil retained in close proximity to the pipeline by a support frame. These approaches, however, are applicable only to pre-installation inspection of a pipeline coating and cannot be used to detect holidays formed during installation or subsequently when the pipeline is buried in the ground or otherwise inaccessible.

Other apparatus have been suggested as being useful for detecting holidays in buried or submerged pipelines. For example, U.S. Pat. No. 3,066,256 of Rasor discloses locating flaws in the coating of a buried pipeline by applying an alternating current to the pipeline and moving a capacitive probe over the ground above the pipeline to detect an alternating field setup by leakage current, the probe producing an audible signal when the probe approaches a flaw in the coating. U.S. Pat. No. 2,501,598 of Eltenton et al. discloses a method of measuring the static magnetic field surrounding a pipeline by the use of a gradiometer. U.S. Pat. No. 3,745,452 of Osburn et al. discloses apparatus for detecting static direct current flowing at a holiday in a pipeline coating employing a vertically oriented flux gate magnetometer directly above the pipeline to sense the magnetic field associated with the holiday current. U.S. Pat. No. 3,536,831 of Smith teaches detecting flaws in the plastic coating of an undersea pipeline by applying an alternating current to the pipeline and detecting leakage current from the flaws with a pair of current conducting probes.

SUMMARY OF THE INVENTION

A method and apparatus are provided for locating and tracking a subterranean pipeline and for sensing the location and magnitude of breaks or holidays in an insulating coating on the pipeline. An alternating current is induced in the pipeline in the vicinity of a portion of the pipeline to be surveyed. A first current sensing means responsive to the normal electromagnetic field generated by the alternating current in the pipeline senses the phase and magnitude of the induced alternating current in the pipeline and emits a first signal representative thereof. A second current sensing means also responsive to the normal electromagnetic field senses the relative location of the second sensing means and the pipeline and emits a second signal representative thereof. The phase relationship of the first and second signals are compared to provide a directional indicator signal used in the tracking of the pipeline. A third current sensing means comprising a pair of spaced coil members responsive to an electromagnetic field associated with leakage current running into or out of the pipeline through a holiday in the pipeline coating senses the phase and magnitude of leakage current and emits a third signal representative thereof. The third signal is amplified and displayed to provide an indication of the presence and location of the pipeline holiday.

DESCRIPTION OF THE PREFERRED EMBODIMENTS

Figure 1:
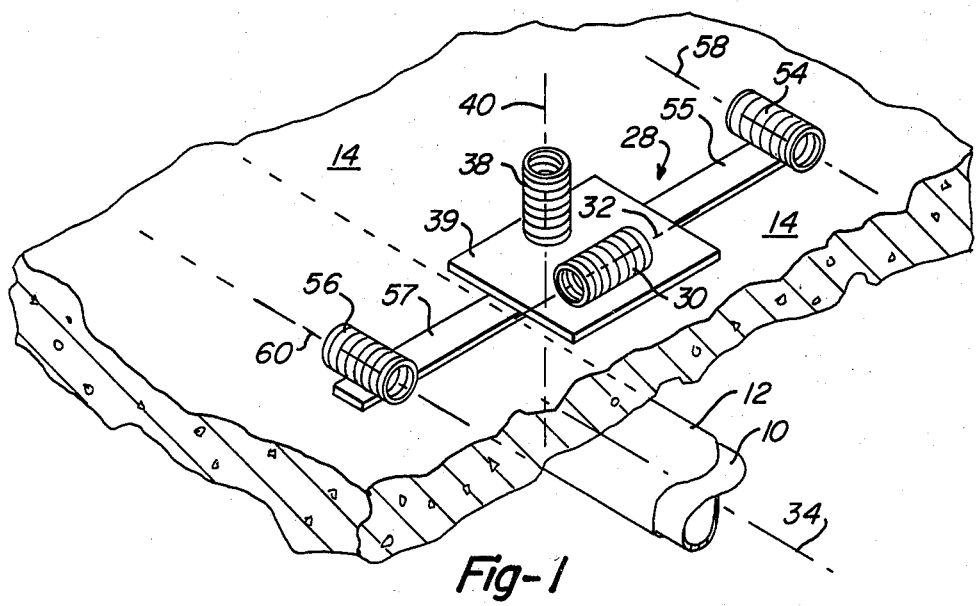
FIG. 1 is a perspective view of a portion of the apparatus of the invention showing the relative location of the sensing means and the pipeline during a pipeline surveying operation.

Referring to FIGS. 1–4, a pipeline 10 having an insulating coating 12 is shown as buried beneath the ground 14. The insulating coating 12 of the pipeline is shown to have developed a break or holiday 16 through which leakage current may flow from the pipeline into the surrounding soil, or from the soil into the pipeline.

An alternating electrical current source 18 is electrically connected at 20 to pipeline 10, such as by wire 22, and an alternating current is induced in the pipeline. For convenience, the electrical connection 20 may be made at test points normally provided in a subterranean pipeline for cathodic protection. Optimum frequencies of the alternating current induced in the pipeline are dependent upon the size and nature of the pipeline to be surveyed, the nature of the pipeline coating, the electrolytic environment of the pipeline, and other factors. However, for most purposes, the alternating current preferably has a frequency of about 30 to about 30,000 Hz., more preferably about 300 to about 3,000 Hz. and most preferably about 600 to about 1,000 Hz. Once alternating current has been induced in the pipeline, the method and apparatus hereinafter described is used to survey the pipeline for holidays for distances up to about two miles on either side of the connection point 20, depending on the wattage of the current induced in the pipeline, soil conditions, depth of the pipeline beneath the surface of the ground, and other factors.

Figure 4:
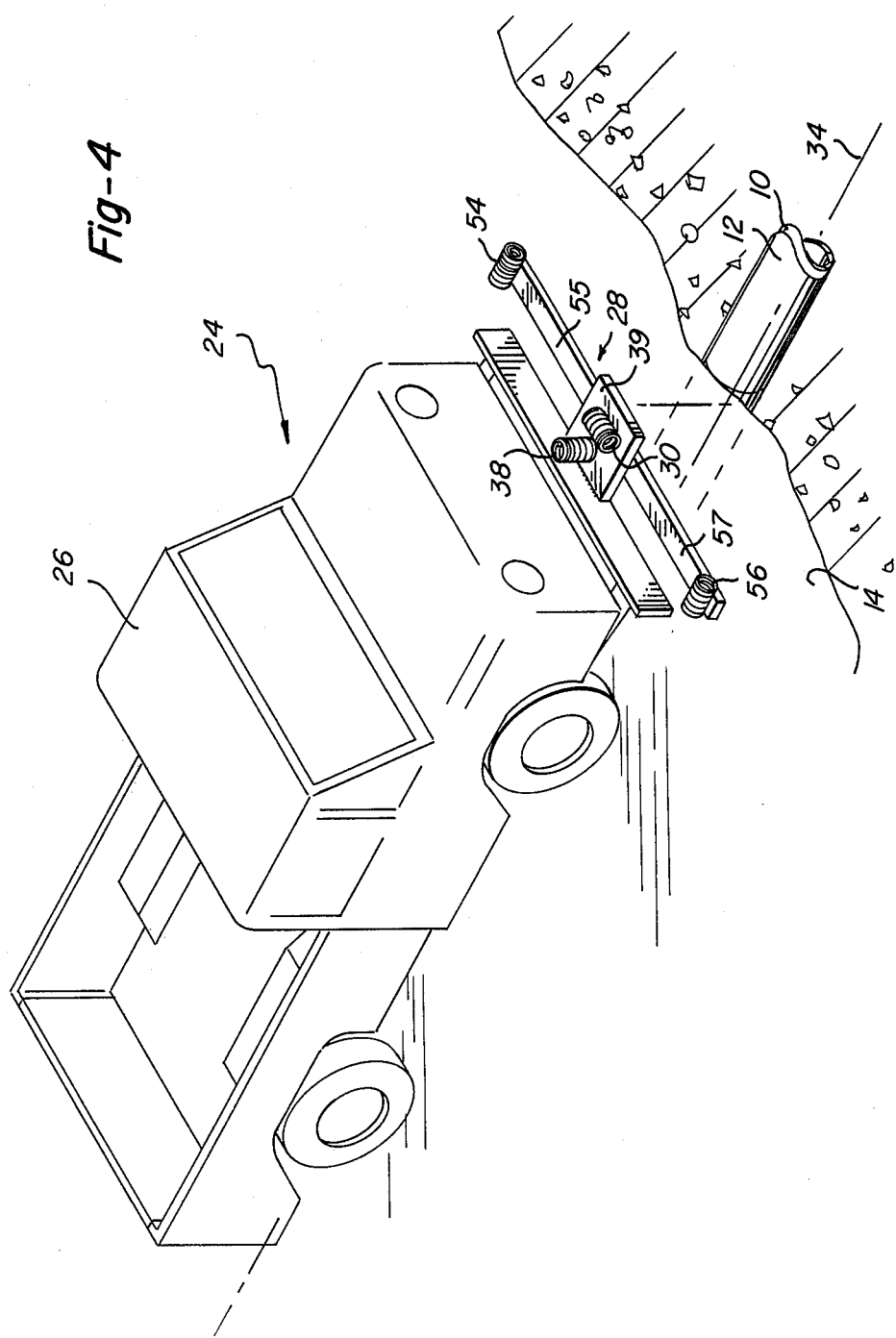
FIG. 4 is a perspective view of a portion of the apparatus of the invention showing illustrative mobile support means and sensing means.

Referring to the illustrative embodiment of FIG. 4, the holiday detection apparatus comprises mobile support means 24 for supporting the holiday detection apparatus and for moving the apparatus along the surface of the ground above the subterranean pipeline. As shown in FIG. 4, the mobile support means 24 may comprise a truck 26 provided with a holiday detection apparatus support frame 28, although other type mobile vehicles and support frame structures may be used for this purpose.

Figure 2:
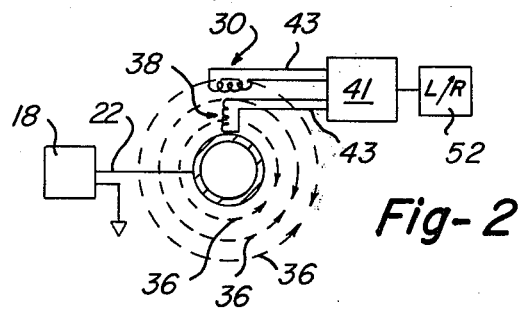
FIG. 2 is a schematic drawing of the pipeline locating and tracking portion of the apparatus of the invention.

A first electrical current sensing means for sensing the phase and magnitude of the alternating current in the pipeline and for providing a first signal representative thereof is provided on the mobile support means. In the embodiment shown in the drawings, the first current sensing means comprises a first coil member 30 adapted to be oriented directly over the pipeline 10 with its central axis 32 located horizontally to the ground 14, and spaced from and perpendicularly to the central axis 34 of the pipeline. The alternating electrical current applied to the pipeline results in the formation of a normal alternating electromagnetic field surrounding the pipeline. The orientation of the normal electromagnetic field surrounding the pipeline is represented in FIG. 2 by arrows 36. As the first sensing means 30 is moved along the pipeline, as will be hereinafter further described, and through the normal electromagnetic field, an alternating current is induced in the first coil member which is directly related to the phase and magnitude of the alternating current in the portion of the pipeline located beneath the first coil member. The induced alternating current in the first coil member thereby provides a first signal, or reference signal, representative of the phase and magnitude of the normal current in the portion of the pipeline beneath the first sensing means.

The apparatus further comprises a second electrical current sensing means for sensing the relative location of the second sensing means and the pipeline and for emitting a second signal representative thereof. In the embodiment shown in the drawings, the second sensing means comprises a second coil member 38 adapted to be located directly over the pipeline 10 with its central axis 40 located vertically to the ground and perpendicularly to the central axis 34 of the pipeline. When located directly over pipeline 10, the normal electromagnetic field represented by arrows 36 cuts across the coils of second coil member 38 and has no significant effect on the second coil member. However, when above the ground to either side of the pipeline an alternating current is induced in the second coil member which is directly related to the relative position of the second coil member and the pipeline. The induced alternating current in the second coil member thereby provides a second signal representative of the relative position of the second coil member and the pipeline. The coil members 30, 38 may be maintained in the desired orientation, for example, by mounting the coil members on support platform 39 of support frame 28 at about the lateral center of the mobile support means.

Figure 5:
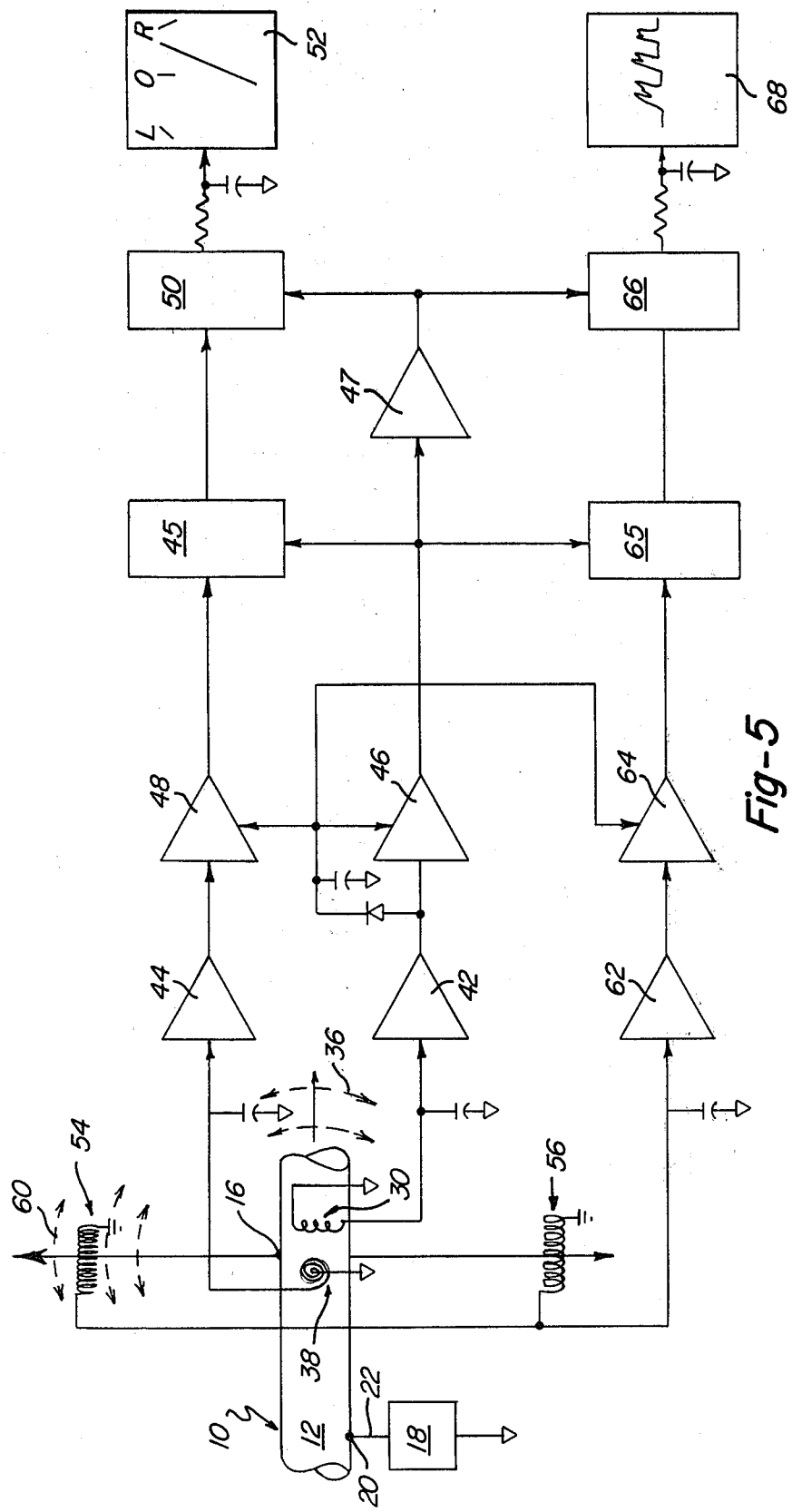
FIG. 5 is a schematic drawing of the apparatus of the invention.

Referring to FIGS. 2 and 5, the signals from the first coil member 30 and the second coil member 38 are fed to signal analyzer 41 through lead wires 43, wherein the signals are filtered, such as by filters 42, 44, respectively, to eliminated undesirable background noise, and then amplified, such as by amplifiers 46, 48, respectively. An automatic gain controller 45 may be incorporated into the circuit to provide adjustment-free sensitivity to weak signals and to provide a sufficient signal level for subsequent signal analysis. The first signal, or reference signal, is then introduced into zero cross detection means 47 for detecting the zero voltage points of the first signal and providing an output signal representative thereof. The output from zero cross detection means 47 and the second signal are then compared by a phase detector, such as phase lock amplifier 50, for determining if the signals are in-phase or out-of-phase. The phase detector, or phase lock amplifier 50, provides a positive or negative output voltage depending on the phase comparison determination, the amplitude of which is dependent on the distance of coil member 38 from the vertical center of the pipeline. The output voltage of phase lock amplifier 50 is therefore representative of both the side of the pipeline's vertical center on which coil member 38 is located, and the distance of coil member 38 from the pipeline's vertical center. Display means are provided for displaying the output from phase lock amplifier 50 to permit the mobile support means to be guided in response to the phase condition and amplitude of the signals. As shown in FIGS. 2 and 5, for example, the indicator means comprises a center zero steering meter 52 preferably located in the cab of truck 26 to permit the truck operator to steer the truck in response to the indication of the steering meter and thereby to maintain the truck directly over pipeline 10 during the pipeline surveying operation. Alternatively, the display means may comprise a series of lights, an audible indicaton, a graphic indication or other means suitable for informing the operator of the mobile support means of the relative location of the second coil member and the pipeline. With the apparatus as heretofore described, the operator of the mobile support means is able to track the pipeline and to guide or steer the mobile support means so as to maintain the holiday detection apparatus in a constant orientation relative to the pipeline during the pipeline surveying operation.

Figure 3:
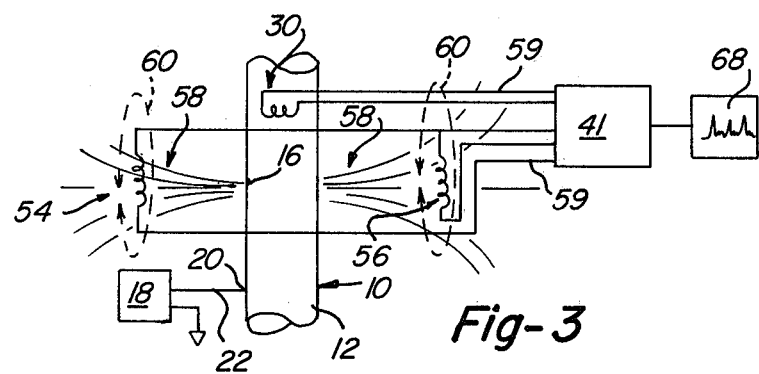
FIG. 3 is a schematic drawing of the holiday sensing portion of the apparatus of the invention.

The holiday detection apparatus further comprises a third electrical current sensing means for sensing the presence of a holiday in the insulating coating of the pipeline and for producing a signal representative of the phase and magnitude of electrical current flowing through the holiday. The third sensing means comprises a pair of coil members 54, 56 on the mobile support means adapted to be located above the gound approximately an equal distance from a vertical plane including the central axis 34 of pipeline 10 with their central axes 58, 60 running parallel to central axis 34 of the pipeline. When the coil members 54, 56 are moved along the portion of pipeline 10 containing holiday 16, an alternating current is induced in the coil members 54 and/or 56 representative of the phase and magnitude of the leakage current flowing through the holiday. As shown in FIG. 3, leakage current 58 flowing through holiday 16 generates a corresponding electromagnetic field, represented by arrows 60, in the vicinity of third coil members 54, 56. As the coil members 54, 56 are passed through the electromagnetic field 60, an alternating current is induced in the coil members 54, 56 representative of the phase and magnitude of the current flowing through the holiday. As shown in FIGS. 3 and 5, coil members 54, 56 are interconnected so that current induced in the coil members by leakage current flowing into or away from the pipeline is additive, while background current resulting in electromagnetic fields flowing across the coils from the same direction will cancel out. The sum of the induced currents in coil members 54, 56 therefore provides a signal indicative of the presence of a holiday and the phase and magnitude of current flowing through the holiday. As shown in FIGS. 1 and 4, coil members 54, 56 may be maintained in the desired orientation by mounting the coil members on support arms 55, 57 of support frame 28, which may extend laterally, for example, about three to about five feet or more from the vertical plane including pipeline central axis 34.

Referring to FIGS. 3 and 5, the signal from third coil members 54, 56 is fed to signal analyzer 41 through lead wires 59, wherein the signal is filtered, such as through filter 62, and amplified, such as by amplifier 64. An automatic gain controller 65, operably driven in response to the amplified first or reference signal from first coil member 30, may be provided in the circuit to amplify the output from amplifier 64 in response to the amplitude of the reference signal. The output from zero cross detection means 47 and the signal from the third coil members 54, 56 are then fed into phase lock amplifier 66 which selectively amplifies a narrow band of frequencies of the signal from automatic gain controller 65 about a mid-band frequency value determined by the signal from the reference signal zero cross detection means 47. The phase lock amplifier 66 thereby provides an output signal representative of the magnitude of leakage current flowing through holiday 16 in the coating of the pipeline. Display means 68 are provided for displaying the output from phase lock amplifier 66.

In a presently particularly preferred embodiment, display means 68 comprises a chart recorder in which the paper flow rate is driven by the odometer or drive train of the mobile support means. In this manner, a record is made showing the magnitude of any sensed holidays and the location of the holidays as the distance traveled by the support means from a given starting point. Alternatively, indicator means 68 may indicate the presence of a holiday by emitting an audible signal or by other suitable means.

The operating efficiency of the apparatus is somewhat dependent upon uniformly maintaining the orientation of coil members 30, 38, 54 and 56 as heretofore described. It is therefore a further presently particularly preferred embodiment to provide stabilizing means on the mobile support means for stabilizing the orientation of support frame 28 and coil members 30, 38, 54 and 56 with respect to pipeline 10. A gravitationally or inertially controlled support framer stabilizer, or other suitable stabilizing means, may be used for this purpose.

In operation, an alternating current source having an output of, for example, 750 Hz. and 100 watts, is electrically connected to a subterranean pupeline 10. A mobile vehicle such as truck 26 provided with the apparatus as heretofore described is driven on the ground over a portion of the pipeline 10 within up to about two miles of the alternating current electrical connection point. The phase and magnitude of the alternating current in the pipeline are sensed by coil member 30, and the relative location of the truck 26 and the pipeline 10 is sensed by coil member 38, as an alternating current is induced in the coil members by driving the coil members through the normal electromagnetic field about the pipeline resulting from the alternating current induced in the portion of the pipeline being surveyed. Coil members 30, 38 are preferably wound for optimum sensitivity to the normal electromagnetic field about the pipeline, and may be air core coils, magnetic core coils or the like. The phase relationship of current induced in coil members 30, 38 is determined by phase lock amplifier 50, which emits a signal representative of the relative location of the truck and the pipeline. The truck 26 is guided by the truck operator over the pipeline in response to the signal from phase detector 50.

As truck 26 is driven along pipeline 10, coil members 54, 56 are passed through electromagnetic fields resulting from leakage current flowing through holidays in the insulating coating of the pipeline, thereby inducing an alternating current in the coil members 54, 56 representative of the presence and magnitude of the holidays. The portion of the signal from coil members 54, 56 which remains in phase with the first, or reference, signal from coil member 30 is amplified by phase lock amplifier 66 and is displayed on chart recorder 68 or other display means to provide an indication of the presence, location and magnitude of holidays in the pipeline. The chart recorder is preferably driven by the odometer of truck 26 to provide a distance dependent graph of holidays in the portion of the pipeline surveyed.

It has been found that the foregoing method and apparatus provides a highly reliable and economically efficient means for locating and determining the magnitude of holidays in the insulating coating of subterranean pipelines, which may be employed with a minimum of manpower and survey cost.

The pipeline holiday detection apparatus has been heretofore described in connection with various presently preferred embodiments. Various modifications may be apparent to those skilled in the art. Any such modifications are intended to be within the scope of the appended claims, except insofar as precluded by the prior art.

What is claimed is:

1. Apparatus for detecting and locating a holiday in an insulating coating of a subterranean electrically conductive pipeline comprising:
   an alternating electrical current source electrically connected to an electrically conductive pipeline having an insulating coating for inducing an alternating electrical current flowing in a direction parallel to the central axis of the pipeline in at least a portion of the pipeline,
   a holiday current sensing means for sensing the presence of a holiday in the insulating coating of the pipeline and for producing a signal representative of electrical current flowing in a direction normal to the central axis of pipeline through the holiday, the holiday current sensing means comprising a pair of coil members adapted to be located above the ground approximately an equal distance from a vertical plane including the central axis of the pipeline with the central axes of the coil members being oriented generally parallel to the central axis of the pipeline, whereby an electrical current signal is induced in the pair of coil members by an electromagnetic field generated by current flowing through the holiday,
   a first display means for displaying the signal induced in the pair of coil elements, the signal being representative of the presence and magnitude of the holiday, a mobile support means for supporting the pair of coil members and moving the pair of coil members relative to the pipeline, and a pipeline sensing means for sensing the location of the pipeline and for producing a signal representative of the relative position of the pipeline sensing means and the pipeline, the pipeline sensing means comprising a first electrical current sensing means mounted on the mobile support means for sensing the phase and magnitude of the alternating current flowing axially in the pipeline and for providing a first signal representative thereof, a second electrical current sensing means mounted on the mobile support means for sensing the relative location of the second sensing means and the pipeline and for providing a second signal representative thereof, and phase comparison means for comparing the phase relationship of the first and second signals, the first electrical sensing means comprising a first coil member adapted to be oriented over the pipeline with its central axis located horizontally to the ground and perpendicularly to the central axis of the pipeline whereby a first electrical signal representative of the phase and magnitude of current flowing axially in the pipeline is induced in the first coil member by a normal electromagnetic field generated by the current flowing axially in the pipeline; the second electrical current sensing means comprising a second coil member adapted to be oriented over the pipeline with its central axis located vertically to the ground and perpendicularly to the central axis of the pipeline, whereby a second electrical current signal representative of the relative location of the second coil member and the pipeline is induced in the second coil member by the normal electromagnetic field generated by current flowing axially in the pipeline.

2. The apparatus of claim 1 wherein the phase comparison means comprises a zero cross detection means for detecting the zero voltage points of the first electrical current signal and providing an output signal representative thereof; and a first phase lock amplifier for receiving the output signal from the zero cross detection means and the second electrical current signal, and for providing an output signal representative of the relative phase condition of the zero cross detection means output signal and the second electrical current signal, and of the magnitude of the second electrical current signal.

3. The apparatus of claim 2 which further comprises a second display means for displaying the output signal from the first phase lock amplifier.

4. The apparatus of claim 3 wherein the mobile support means is guidable in response to the second display means.

5. The apparatus of claim 3 wherein the second display means comprises a center zero steering meter.

6. The apparatus of claim 2 which further comprises selective amplification means for selectively amplifying a relatively narrow band of frequencies from the electrical current signal of the holiday current sensing means about a mid-band frequency value determined by the output signal and for supplying the selectively amplified signal to the first display means.

7. The apparatus of claim 6 wherein the selective amplification means comprises a second phase lock amplifier.

8. The apparatus of claim 7 wherein the first display means comprises a chart recorder.

9. The apparatus of claim 8 wherein the flow of paper in the chart recorder is driven in response to the distance traveled by the mobile support means.

10. A method of detecting and locating a holiday in an insulating coating of a subterranean electrically conductive pipeline comprising:

inducing an alternating electrical current in at least a portion of the pipeline, orienting a pair of coil members on opposite sides of a vertical plane including the longitudinal axis of the pipeline in generally longitudinally parallel relationship relative to the pipeline, moving the pair of coils through an electromagnetic field generated by electric current flowing in a direction normal to the central axis of the pipeline through a holiday in the insulating coating of the pipeline whereby an electrical current signal is induced in the pair of coil members representative of the presence and magnitude of the holiday, displaying the electrical current signal, and sensing a normal electromagnetic field generated by the current flowing axially in the pipeline, determining the relative relationship between the pair of coil members and the pipeline from the sensed normal electromagnetic field and then guiding the pair of coil members through the electromagnetic field generated by electrical current flowing radially through the holiday in response to the sensed normal electromagnetic field.

* * * * *